United States Patent
Stadler et al.

(10) Patent No.: US 12,132,017 B2
(45) Date of Patent: Oct. 29, 2024

(54) METHOD OF SOLDERING A SEMICONDUCTOR CHIP TO A CHIP CARRIER

(71) Applicant: Infineon Technologies AG, Neubiberg (DE)

(72) Inventors: Michael Stadler, Munich (DE); Paul Armand Asentista Calo, Melaka (MY)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 18/483,977

(22) Filed: Oct. 10, 2023

(65) Prior Publication Data

US 2024/0055376 A1    Feb. 15, 2024

Related U.S. Application Data

(62) Division of application No. 17/404,031, filed on Aug. 17, 2021, now Pat. No. 11,830,835.

(30) Foreign Application Priority Data

Aug. 26, 2020 (DE) .................. 102020122323.4

(51) Int. Cl.
H01L 23/00 (2006.01)
(52) U.S. Cl.
CPC .............. H01L 24/05 (2013.01); H01L 24/13 (2013.01); H01L 24/81 (2013.01); H01L 2224/02245 (2013.01); H01L 2224/02255 (2013.01); H01L 2224/0401 (2013.01); H01L 2224/13026 (2013.01); H01L 2224/81024 (2013.01);
(Continued)

(58) Field of Classification Search
CPC . H01L 2224/81024; H01L 2224/13013; H01L 2924/13091
See application file for complete search history.

(56) References Cited

U.S. PATENT DOCUMENTS 5,936,309 A    8/1999  Kim
6,228,466 B1   5/2001  Tsukada et al.
(Continued)

FOREIGN PATENT DOCUMENTS

DE    102018124497 A1   4/2020
JP       2013152982 A    8/2013
(Continued)

Primary Examiner — Dale E Page
Assistant Examiner — Wilner Jean Baptiste
(74) Attorney, Agent, or Firm — Murphy, Bilak & Homiller, PLLC

(57) ABSTRACT

A method of soldering a semiconductor chip to a chip carrier includes arranging a solder deposit including solder and solder flux between a contact portion of the carrier and a contact portion of a chip pad arranged at a surface of the semiconductor chip. Arranging a dielectric layer at the surface of the semiconductor chip. The dielectric layer includes an opening within which the contact portion of the chip pad is exposed. The dielectric layer further includes arranging a solder flux outgassing trench separate from the opening and intersecting with the solder deposit. The method further includes melting the solder deposit which causes liquid solder to be moved over the solder flux outgassing trench for extraction of flux gas.

18 Claims, 5 Drawing Sheets

(52) U.S. Cl.
CPC ............... *H01L 2224/81815* (2013.01); *H01L 2924/13091* (2013.01)

(56) References Cited

U.S. PATENT DOCUMENTS

| | | | |
|---|---|---|---|
| 8,946,906 B2 * | 2/2015 | Maeda | .............. H01L 23/49822 |
| | | | 257/E23.145 |
| 9,620,446 B2 * | 4/2017 | Shimizu | ................ H05K 1/115 |
| 11,227,837 B2 | 1/2022 | Yu et al. | |
| 2002/0063332 A1 | 5/2002 | Yamaguchi et al. | |
| 2009/0001138 A1 | 1/2009 | Tameerug | |
| 2017/0005052 A1 | 1/2017 | Chen et al. | |

FOREIGN PATENT DOCUMENTS

| | | |
|---|---|---|
| WO | 2010032192 A1 | 3/2010 |
| WO | 2011125434 A1 | 10/2011 |
| WO | 2020157815 A1 | 8/2020 |

\* cited by examiner

US 12,132,017 B2

METHOD OF SOLDERING A SEMICONDUCTOR CHIP TO A CHIP CARRIER

TECHNICAL FIELD

This disclosure relates generally to the field of semiconductor chips, and in particular to the technique of soldering semiconductor chips to a carrier.

BACKGROUND

When soldering a semiconductor chip to a chip carrier, undesired solder voids may be trapped in the solidified solder material between the chip pad and the carrier. Such solder voids may evolve to substantial sizes and may significantly decrease the quality and reliability of the solder joint.

Vacuum soldering is a technique known to reduce the amount or sizes of solder voids generated during soldering. Vacuum soldering, however, is a costly approach and is not always suited for integration in the manufacturing process.

Hence, the generation of high quality solder joints is an ongoing challenge for progressing to highly reliable semiconductor devices.

SUMMARY

According to an aspect of the disclosure, a semiconductor chip includes a chip pad arranged at a surface of the semiconductor chip. A dielectric layer is arranged at the surface of the semiconductor chip. The dielectric layer has an opening within which a contact portion of the chip pad is exposed, the opening having at least one straight side. The dielectric layer comprises a solder flux outgassing trench arranged separate from and in the vicinity of the at least one straight side of the opening and extends laterally beyond sides of the opening adjoining the straight side.

According to another aspect of the disclosure, a semiconductor device includes a chip carrier and a semiconductor chip according to the above description soldered to the chip carrier.

According to another aspect of the disclosure, a method of soldering a semiconductor chip to a chip carrier includes arranging a solder deposit including solder and solder flux between a contact portion of the carrier and a contact portion of a chip pad arranged at a surface of the semiconductor chip, wherein a dielectric layer is arranged at the surface of the semiconductor chip and has an opening within which the contact portion of the chip pad is exposed. The dielectric layer further comprises a solder flux outgassing trench arranged separate from the opening and intersecting with the solder deposit. The solder deposit is melted, thereby causing liquid solder to be moved over the solder flux outgassing trench for extraction of flux gas.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, the terms "electrically connected" or "connected" or similar terms are not meant to mean that the elements are directly contacted together; intervening elements may be provided between the "electrically connected" or "connected" elements, respectively. However, in accordance with the disclosure, the above-mentioned and similar terms may, optionally, also have the specific meaning that the elements are directly contacted together, i.e. that no intervening elements are provided between the "electrically connected" or "connected" elements, respectively.

The words "over" or "beneath" with regard to a part, element or material layer formed or located or disposed or arranged or placed "over" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1A:
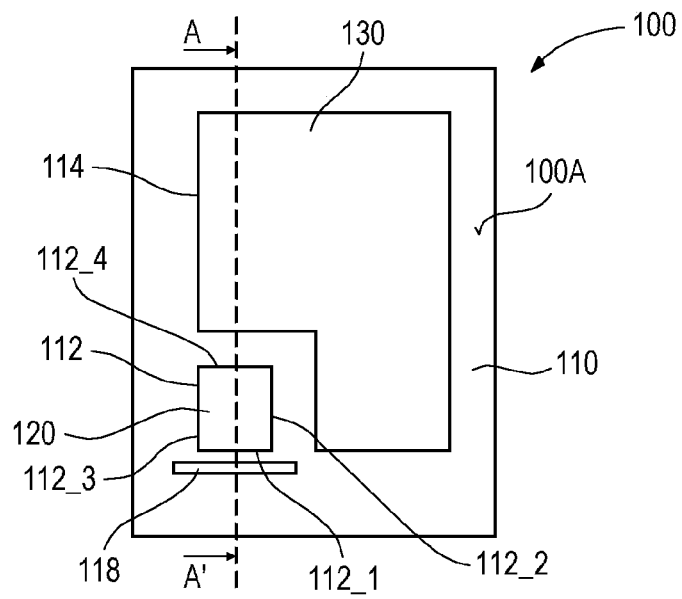
FIG. 1A is a schematic top view on an exemplary semiconductor chip including a chip pad associated with a solder flux outgassing trench.
Figure 1B:
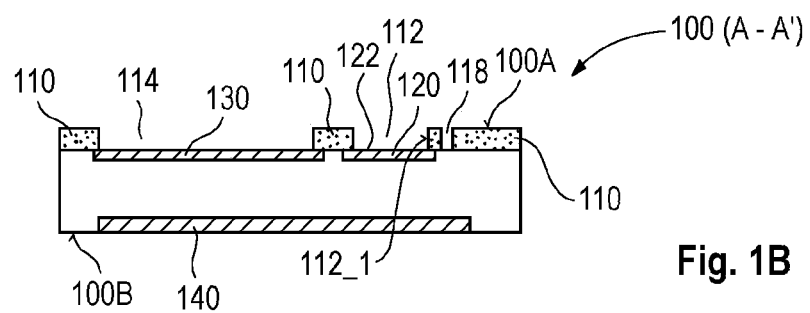
FIG. 1B is a schematic cross-sectional view of the semiconductor chip of FIG. 1A along line A-A'.

FIG. 1A illustrates a schematic top view of a semiconductor chip 100 having a top surface 100A. FIG. 1B illustrates a schematic cross-sectional view of the semiconductor chip 100 along line A-A' in FIG. 1A.

A chip pad 120 is arranged at the top surface 110A of the semiconductor chip 100. The chip pad 120 may be made of metal or a metal alloy, e.g. copper or copper alloy. A dielectric layer 110 is arranged at the surface 100A of the semiconductor chip 100. The dielectric layer 110 may be an electrically insulating polymer layer, e.g. a polyimide layer. The dielectric layer 110 has an opening 112 within which a contact portion 122 of the chip pad 120 is exposed. The opening 112 has at least one straight side 112_1.

The dielectric layer 110 includes a solder flux outgassing trench 118. The solder flux outgassing trench 118 is separate from and in the vicinity of the straight side 112_1 of the opening 112 in the dielectric layer 110. The solder flux outgassing trench 118 does not communicate with the opening 112 in the dielectric layer 110. Further, the solder flux outgassing trench 118 extends laterally (i.e. in the left-to-right direction and in the right-to-left direction in FIG. 1A) beyond sides 112_2, 112_3 of the opening 112 adjoining the straight side 112_1. As a consequence, the solder flux outgassing trench 118 is longer than the straight side 112_1 of the opening 112. A side of the opening 112 opposite the straight side 112_1 is referred to by reference sign 112_4.

The dielectric layer 110 may include other openings such as, e.g., opening 114 which may expose other chip pads (electrodes) of the semiconductor chip 110, e.g. chip pad 130. In the schematic example of a semiconductor chip 100, the chip pad 130 may be a load electrode chip pad of the semiconductor chip 100 and the chip pad 120 may be a control electrode or sense electrode chip pad of the semiconductor chip 100. Further, by way of example, the semiconductor chip 100 may include a chip pad 140 arranged at a bottom surface 100B of the semiconductor chip 100 opposite the top surface 100A.

The semiconductor chip 100 may be configured as a power semiconductor chip. Power semiconductor chips are suitable, in particular, for the switching high currents and/or high voltages (e.g. more than 100 V or 500 V). The semiconductor chip 100 may be of different types, e.g. MOSFET (Metal Oxide Semiconductor Field Effect Transistor), in particular an SJ (super junction)-MOSFET, HEMT (High Electron Mobility Transistor), JFET (Junction Gate Field Effect Transistor), IGBT (Insulated Gate Bipolar Transistor), or bipolar transistor.

The semiconductor chip 100 may have a vertical structure, i.e. the electrical load current may flow in a direction perpendicular to the top and bottom surfaces 100A, 100B of the semiconductor chip 120 from one (load) chip pad 130, 140 to the other (load) chip pad 140, 130. By way of example and without loss of generality, the (load) chip pad 130 may be the source electrode (or emitter electrode in case of an IGBT or a bipolar transistor) and the (load) chip pad 140 may be the drain electrode (or collector electrode in case of an IGBT or a bipolar transistor) of the semiconductor chip 100. However, it is also possible that the semiconductor chip 100 may have a horizontal structure, i.e. the electrical load current may flow in a direction parallel to the top surface 100A. In this case, the load electrodes are typically arranged only at the top surface 100A of the semiconductor chip. 100.

In both cases, the chip pad 120 which is associated with the solder flux outgassing trench 118 may be the control electrode (gate electrode or base electrode in case of a bipolar transistor) or a sense electrode (e.g. source Kelvin sense electrode) of the semiconductor chip 100.

Figure 2A:
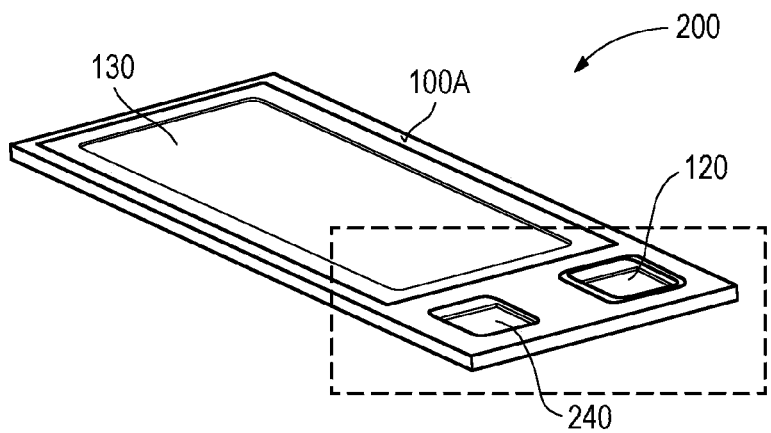
FIG. 2A is a schematic perspective view of an exemplary semiconductor chip including a chip pad associated with a solder flux outgassing trench and a chip pad not associated with a solder flux outgassing trench.
Figure 2B:
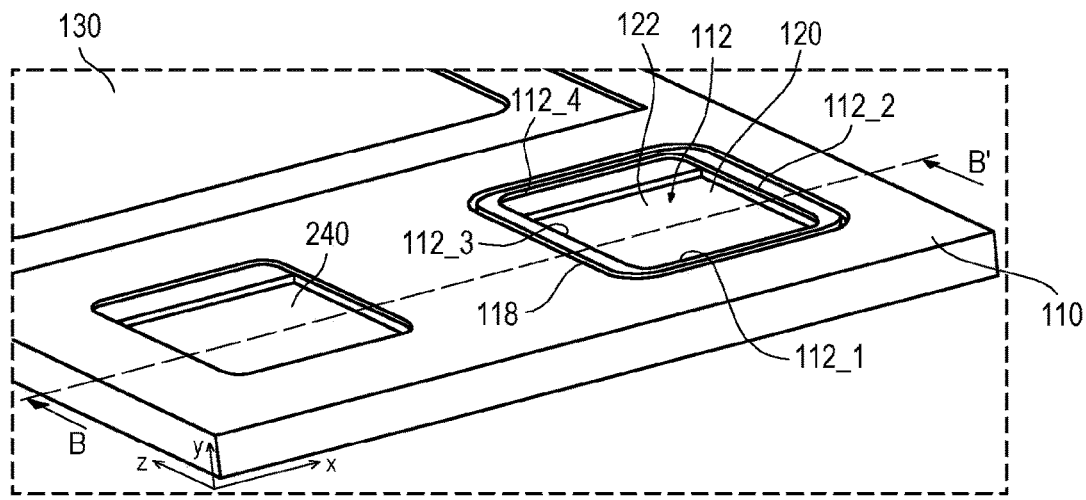
FIG. 2B is an enlarged view of a portion bordered by dashed lines of FIG. 2A.
Figure 3:
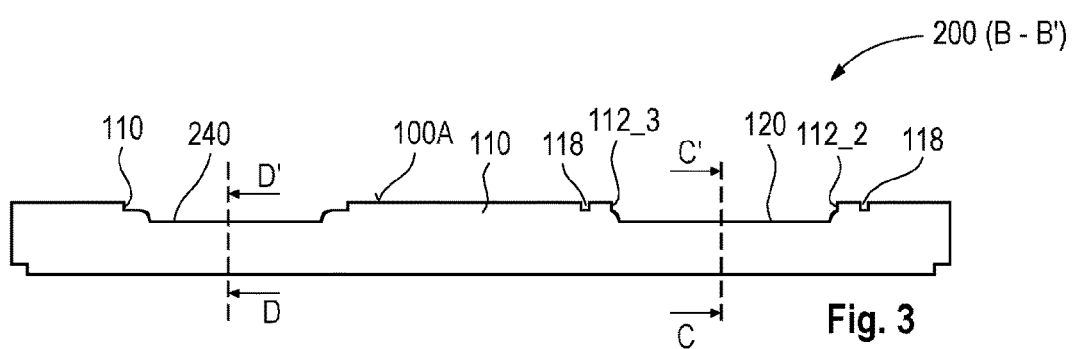
FIG. 3 is a cross-sectional topographic view of the exemplary semiconductor chip of FIGS. 2A-2B along line B-B' of FIG. 2B.

FIGS. 2A, 2B and 3 illustrate the surface topography of an exemplary semiconductor chip 200. The top surface 100A of the semiconductor chip 200 comprises a chip pad 120 designed in accordance with the description of FIGS. 1A and 1B. Further, the top surface 100A of the semiconductor chip 200 exposes, e.g., a chip pad 240 of about the same dimensions than chip pad 120 and a larger chip pad 130 which corresponds to chip pad 130 as described above.

As mentioned above, the contact portion 122 of chip pad 120 is exposed in the opening 112 of the dielectric layer 110. Again, the opening 112 has at least one straight side 112_1 and a section of the solder flux outgassing trench 118 is arranged separate from and in the vicinity of the straight side 112_1 of the opening and extends laterally beyond the sides 112_2, 112_3 of the opening 112 adjoining the straight side 112_1. In the example shown in FIGS. 2A, 2B and 3, the straight side 112_1 is, e.g., the outward front side of the opening 112, the sides 112_2, 112_3 are the longitudinal sides of the opening 112 and side 112_4 opposite the straight side 112_1 is an inward side of the opening 112.

In the example shown in FIGS. 2A, 2B and 3, the solder flux outgassing trench 180 may surround (optionally in a closed fashion) the opening 112 and may optionally have a rectangular shape in top view. More specifically, if the solder flux outgassing trench 118 is designed to surround the opening 112 in the dielectric layer 110, the condition that the solder flux outgassing trench 118 extends laterally beyond sides of the opening 112 adjoining the associated straight side is met for all sides 112_1, 112_2, 112_3, 112_4 of the opening 112. As shown, also the sides 112_2, 112_3 adjoining the straight side and the side 112_4 opposite the straight side 112_1 can be straight.

The chip pad 120 may, e.g., be a control electrode chip pad and the chip pad 240 may, e.g., be a Kelvin sense chip pad of the semiconductor chip 200. It is to be noted that the chip pad 240 is shown not to be associated with a solder flux outgassing trench 118 for the purpose of comparison. However, in practice, both chip pads 120 and 240 may be associated with a solder flux outgassing trench 118.

Figure 4A:
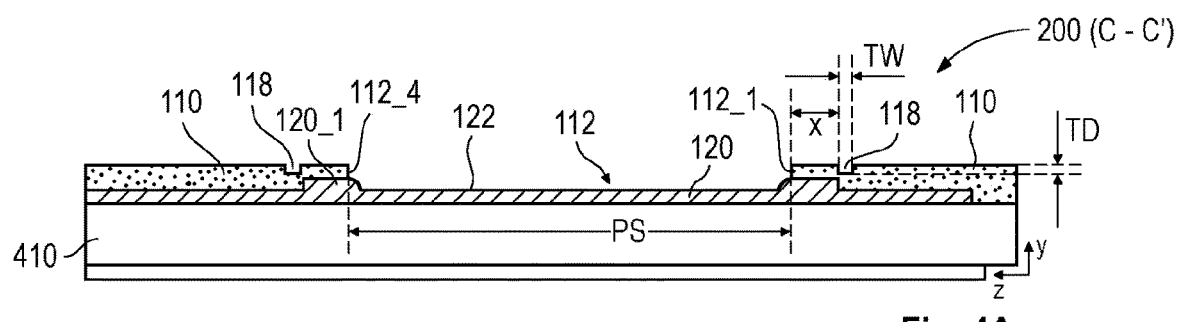
FIG. 4A is a partial cross-sectional view of the exemplary semiconductor chip of FIG. 3 along line C-C' showing a chip pad associated with a solder flux outgassing trench.
Figure 4B:
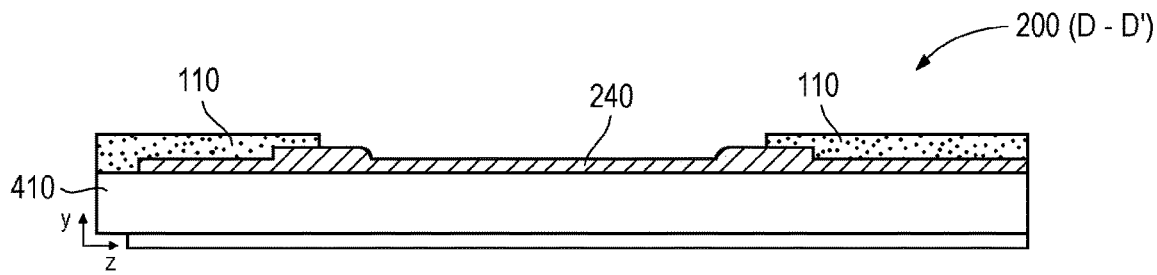
FIG. 4B is a partial cross-sectional view of the exemplary semiconductor chip of FIG. 3 along line D-D' showing a chip pad which is not associated with a solder flux outgassing trench.

FIGS. 4A and 4B are cross-sectional views illustrating an example of how the surface topography of the semiconductor chip 200 may be obtained. Referring to FIG. 4A illustrating a partial sectional view of the semiconductor chip 200 at chip pad 120, the semiconductor chip 200 includes a semiconductor die 410. The semiconductor die 410 may implement an integrated circuit which includes, e.g. a transistor. Further, the semiconductor die 410 may include metal layers forming an integrated electrical interconnect between doped regions of the semiconductor die and the chip pad 120. The doped regions and the metal layers of the electrical interconnect of the semiconductor die 410 are not depicted in FIGS. 4A and 4B for ease of illustration.

Further, the semiconductor die 410 may be covered by a hard passivation layer (not shown). The hard passivation layer is opened beneath the chip pad 120 to allow the chip pad 120 to make electrical contact with the internal metal layers (not shown) of the semiconductor die 410.

The chip pad 120 may optionally comprise an edge elevation 120_1 defining metal side walls of the chip pad 120. In other embodiments, the exposed surface of the chip pad 120 may be planar. The dielectric layer 110 is disposed above the semiconductor die 410. The opening 112 of the dielectric layer 110 exposes a contact portion 122 of the chip pad 120. In this example the contact portion 122 may be formed by the exposed surface of the chip pad 120 which may optionally include the side walls formed by the edge elevation 120_1 of the chip pad 120. However, other configurations (e.g. a planar exposed surface of the chip pad 120) are also possible for obtaining a contact portion 122 of a chip pad 120.

The chip pad 120 may have a pad size along the straight side 112_1 of, e.g., about 0.2 to 0.4 mm, e.g. 0.3 mm. In a direction perpendicular to the straight side 112_1, i.e. in a direction parallel to the sides 112_2 and 112_3 of the opening 112, the pad size PS may, e.g., be between 0.4 mm and 0.6 mm, e.g. 0.5 mm.

The solder flux outgassing trench 118 may, e.g., have a trench width TW between 10 µm and 20 µm, e.g. about 15 µm. A trench depth TD of the solder flux outgassing trench 118 may, e.g., be between 6 µm and 10 µm, e.g. about 8 µm. A distance X between the at least one straight side 112_1 of the opening 112 and the solder flux outgassing trench 118 may, e.g., be between 25 µm to 70 µm, more specifically between 30 µm to 50 µm, or, e.g., about 40 µm.

FIG. 4B illustrates a partial sectional view of the chip pad 240 which is, in this example, not associated with a solder flux outgassing trench 118 for purpose of comparison. However, such solder flux outgassing trench 118 could also be implemented in the dielectric layer 110 of the chip pad 240, and the same dimensional ranges as set out above may then apply.

Figure 5:
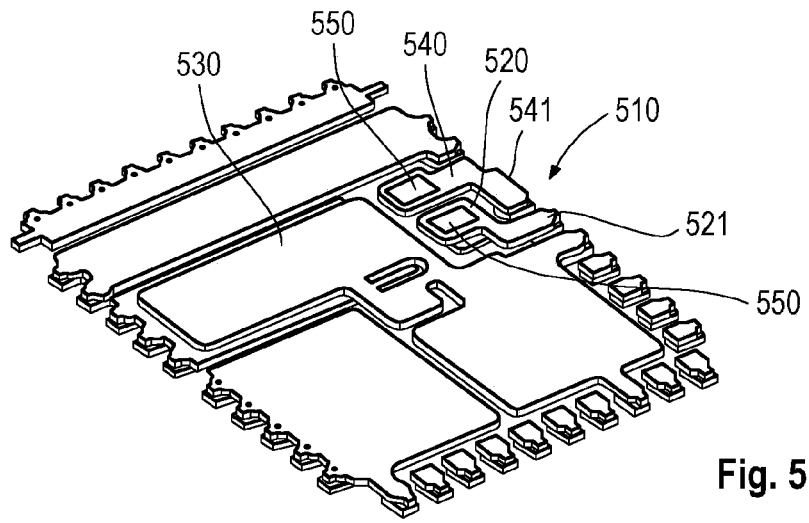
FIG. 5 is a perspective view of an exemplary chip carrier.

FIG. 5 illustrates an exemplary chip carrier 510. The exemplary chip carrier 510 may, e.g., be a leadframe. Other chip carriers such as metal bonded ceramic-based carriers, e.g. a DCB (direct copper bond) carrier, a CPC (copper plated ceramic) carrier, an AMB (active metal brazing) carrier or a DAB (direct aluminum bond) carrier, are also feasible. Further, in other examples, a PCB (printed circuit board) may be used as a chip carrier.

The chip carrier 510 may include a carrier pad 520, a carrier pad 530 and a carrier pad 540. The carrier pad 520 is configured to be bonded to the chip pad 120. The carrier pad 530 is configured to be bonded to the chip pad 130. Further, the carrier pad 540 is configured to be bonded to the chip pad 240. In FIG. 5 a solder deposit 550 is placed on each carrier pad 520, 540. FIG. 5 illustrates an example in which the carrier pad 520 is electrically connected with a control lead 521 of the chip carrier 510 and the carrier pad 540 is electrically connected with a Kelvin sense lead 541 of the chip carrier 510.

Figure 6:
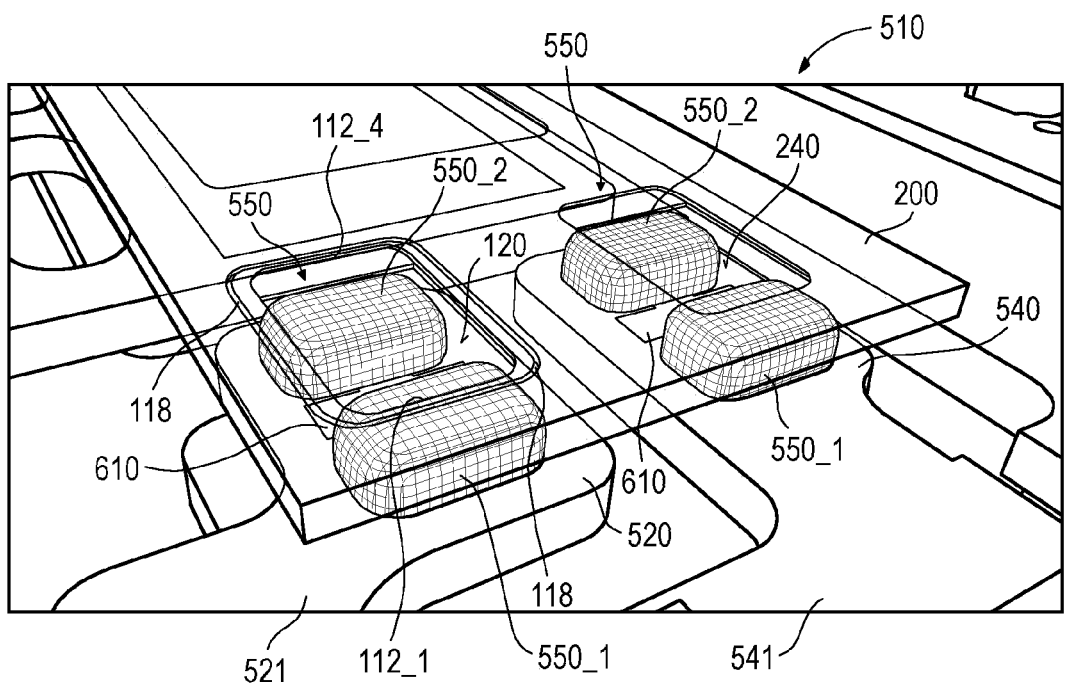
FIG. 6 is a perspective semi-transparent view illustrating exemplary solder deposits on a chip carrier and a semiconductor chip having a chip pad associated with a solder flux outgassing trench and a chip pad not associated with a solder flux outgassing trench held in alignment over the chip carrier.
Figure 7:
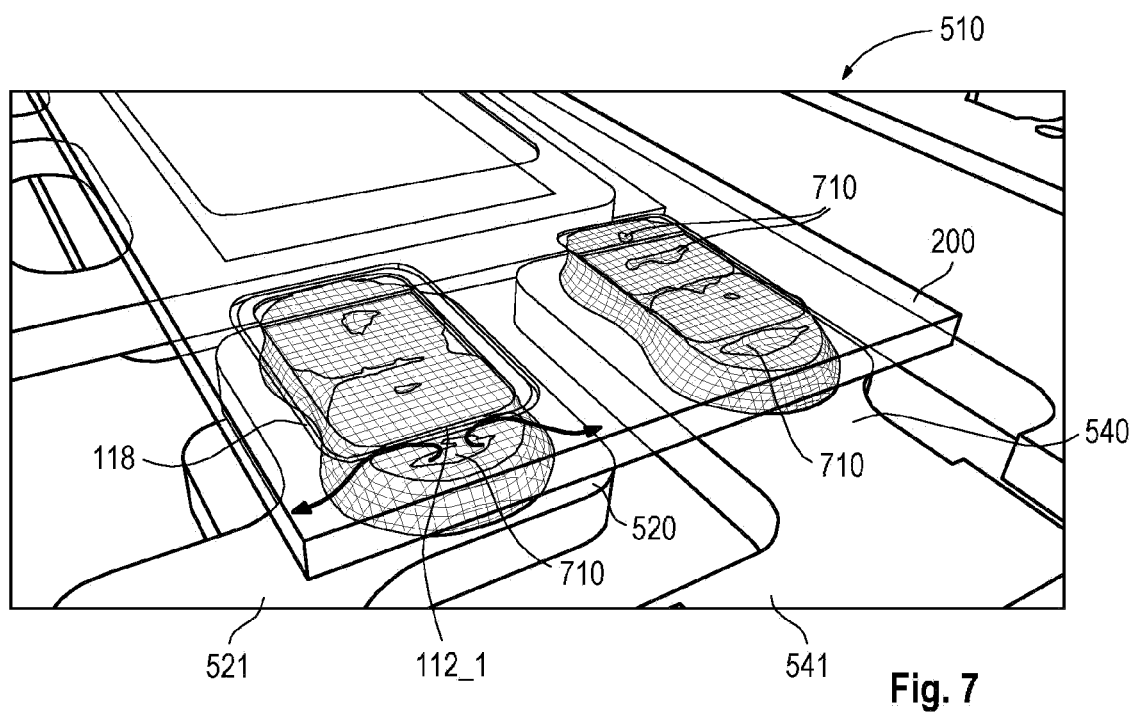
FIG. 7 is a perspective view of the arrangement of FIG. 6 at a stage where chip placement is finished and the solder deposits are melted during reflow.
Figure 8:
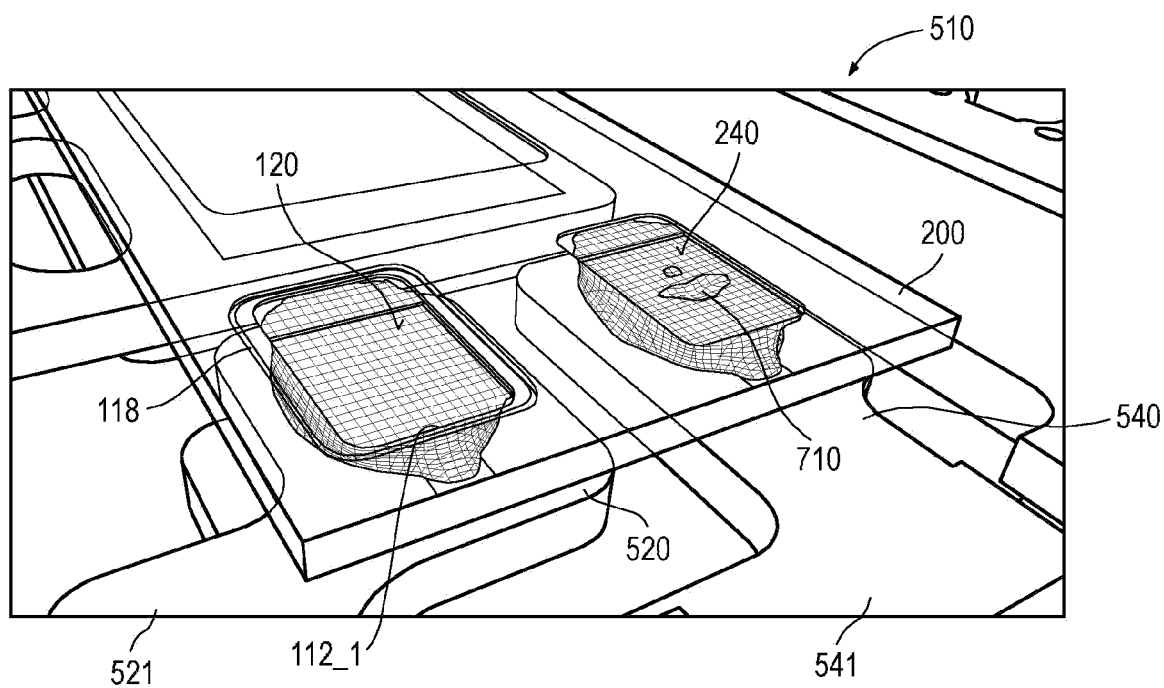
FIG. 8 is a perspective view of the arrangement of FIG. 7 at a stage where soldering is finished and the solder joints are completed.

FIGS. 6 to 8 illustrate exemplary stages of soldering a semiconductor chip as described herein (e.g. semiconductor chip 200 or semiconductor chip 100) to a chip carrier such as, e.g., chip carrier 510. The semiconductor chip 200 is displayed transparently so that the bottom surface 100B of the semiconductor chip 200, the solder deposits 550 and the chip carrier 510 are visible.

Referring to FIG. 6, a solder deposit 550 is arranged on the (control) carrier pad 520 and a solder deposit 550 is arranged on the (sense) carrier pad 540. The carrier pads 520, 540 define contact portions of the chip carrier 510.

In one example one solder deposit 550 may include at least two separate solder bumps 550_1 and 550_2. The solder bumps 550_1, 550_2 may be separated from each other in the longitudinal direction (Z-direction in FIG. 2B) and/or in the X-direction (not shown). In one example, four solder bumps may be used for a solder deposit 550, with two of them spaced apart in the Z-direction and two of them spaced apart in the X-direction.

In one example a cross plating pattern 610 structured in a metal layer of, e.g., Ag may be used as a base layer on which the solder deposit 550 or, in this example, the two solder bumps 550_1, 550_2 are placed. The cross plating pattern 610 may have been formed on the carrier pads 520, 540 prior to the placement of the solder deposits 550.

The solder deposits 550 include a solder material and a solder flux material. A percentage in volume of the solder flux material may be equal to or greater than 25 vol % or 40 vol % or 45 vol % of the volume of the solder deposit. In some cases, the volume of the solder flux material may even be greater than the volume of the solder material in the solder deposit 550. By way of example, the solder deposit 550 may include or be of a solder paste which includes between 45 to 55 vol %, in particular 48 to 52 vol % flux material, the rest solder material.

In FIG. 6, the semiconductor chip 200 is displayed transparently for the sake of explanation. At the stage shown in FIG. 6, the semiconductor chip 200 is aligned with but still spaced apart from the solder deposits 550.

As apparent from FIG. 6, the solder deposit 550 (in this example the solder bump 550_1) may intersect in a vertical projection (Y-direction) with at least a part of the solder flux outgassing trench 118. That is, referring to FIG. 1A, the solder deposit 550 would be at a position to intersect both with the straight side 112_1 of the opening 112 and with the associated solder flux outgassing trench 118. At the opposite side 112_4 of the opening 112, the same positional relationship between the associated part of the solder flux outgassing trench 118 and the solder deposit (e.g. solder bump 550_2) may be in place.

The semiconductor chip 200 is then lowered onto the solder deposits 550. Semiconductor chip placement may optionally be carried out by the application of a relatively small pressure so that the solder deposits 550 may be squeezed and may laterally expand. At least after this expansion, both the straight side 112_1 of the opening 112 and an associated part of the solder flux outgassing trench 118 are covered by the solder deposit 550.

FIG. 7 illustrates the soldering process during reflow, i.e. when the solder deposits 550 become melted. At that stage solder flux gas is generated in the solder. The solder flux gas may form voids in the liquid solder. The voids travel upwards due to buoyancy. As shown at chip pad 240, flux gas solder voids 710 may then be trapped within the solder.

Further, the volume of the solder deposit 550 is reduced by the evaporation of some flux material. This and other processes cause a movement of the solder towards the chip pad center into the central direction.

Stated differently, evaporation of flux leads to a volume reduction. Thereby, the solder may shrink by around 50% in volume. Capillary forces lead to solder attaching to the exposed chip pads 120, 240.

At chip pad 120 the liquid solder moves over the solder flux outgassing trench 118. Due to the surface tension of the liquid solder material, the solder flux outgassing trench 118 is not filled with solder material during this process. On the other hand, the surface tension of the liquid solder decreases in the contact region with the solder flux outgassing trench 118, thereby enabling the solder flux gas to leave the liquid solder and to escape into the solder flux outgassing trench 118.

Since the solder flux outgassing trench 118 is configured to extend beyond the outline of the liquid solder (which may, in the lateral direction, be defined by the lateral sides 112_2, 112_3 of the opening 112) and communicates with outside during solder movement, the flux gas is effectively extracted from the liquid solder. It is apparent from FIG. 7 that during reflow a straight trench portion of the flux outgassing trench 118 always communicates with outside during solder movement. This straight trench portion is oriented substantially perpendicular to the direction of solder movement during reflow.

FIG. 7 illustrates by arrows a void of flux gas which currently escapes through the solder flux outgassing trench 118 formed in the dielectric layer 110.

It is to be noted that the movement of the liquid solder during reflow is affected by various factors. First, there is a contraction of the solder deposit 550 from the reduction in volume caused by solder flux evaporation and/or outgassing. The reduction in volume and the surface tension cause the solder to move in a central direction. Further, the dielectric layer 110 has a very low wettability for liquid solder causing the liquid solder to retract from regions where it would otherwise be in contact with the dielectric layer 110.

Further, as illustrated by way of example in FIGS. 6 to 8, if the solder deposit 550 is partitioned in a plurality of solder bumps 550_1, 550_2 which are spaced apart from each other by a certain gap, the coalescence of these solder bumps 550_1, 550_2 reduces the extension of the solder deposit 550 along an imaginary connection line between the solder bumps 550_1, 550_2. This imaginary connection line may be oriented substantially in the direction (here, e.g., the Z-direction) of the desired solder movement over the portion of the solder flux outgassing trench 118 which communicates with outside (i.e. in this example the portion of the solder flux outgassing trench 118 which is spaced apart from the straight side 112_1 of the opening 112 by the distance X).

Stated differently, the separation of the solder deposit 550 in two or more solder bumps 550_1, 550_2 can be used to increase the solder movement in a preferred direction, thereby increasing the efficiency of flux gas extraction.

The distance X between the solder flux outgassing trench 118 and the opening 112 may be equal at all sides 112_1, 112_2, 112_3, 112_4 of the opening 112. It is also possible that the distance X may be equal at sides 112_1 and 112_4 oriented perpendicular to the main direction of solder movement during reflow, while the distance X may be larger at the sides 112_2 and/or 112_3 oriented parallel to the main direction of solder movement during reflow.

In another example, there is no main direction of solder movement during reflow, i.e. the contraction of the solder deposit during reflow may be equal at all sides 112_1, 112_2, 112_3, 112_4 of the opening. This may, e.g., be the case when the chip pad and/or the opening 112 in the dielectric layer 110 are square-shaped.

Briefly put, the movement of the solder during reflow as well as the flux gas extraction capacity of the solder flux outgassing trench 118 (when it is in contact with the liquid solder) are exploited to remove flux gas from the liquid solder. As a result, void trapping during reflow and void generation in the solder joint can be significantly reduced or impeded.

FIG. 8 illustrates the solder joint after reflow. At chip pad 120 (e.g. gate pad) the solder joint is free of voids. In contrast thereto, a large void 710 remains inside the solder joint at chip pad 240. As apparent from FIG. 8, the solder flux outgassing trench 118 may remain entirely uncovered by solidified solder. The contact between the solder joint and the contact portion 122 of the chip pad 120 may be confined within the opening 112 of the dielectric layer 110 (see FIG. 2B).

Figure 9:
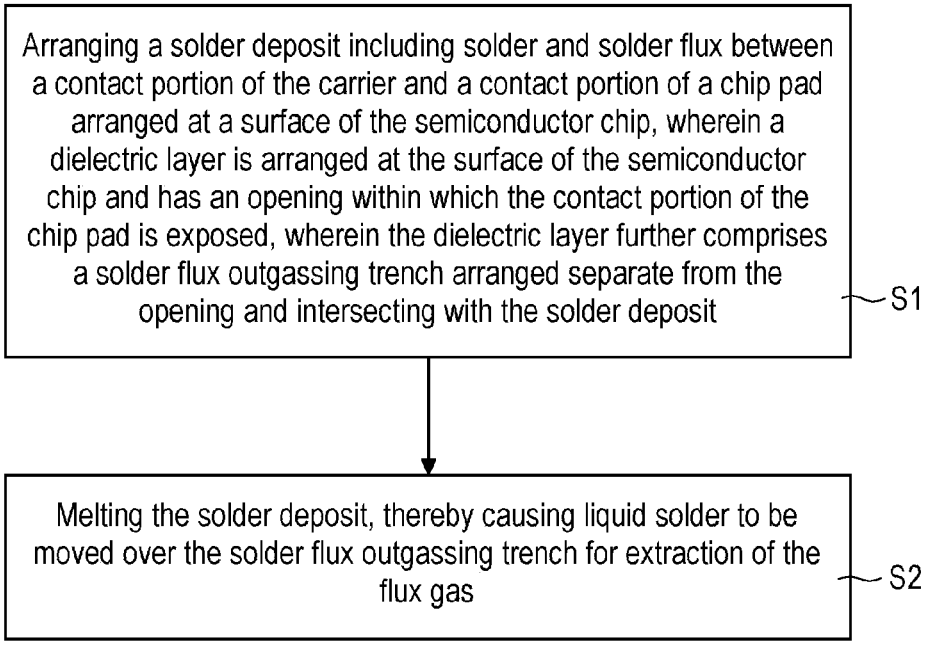
FIG. 9 is a flowchart depicting stages of a method of soldering a semiconductor chip to a chip carrier.

FIG. 9 illustrates stages of a method of soldering a semiconductor chip to a carrier. At S1 a solder deposit is arranged between a contact portion of the carrier and a contact portion of the chip pad arranged at a surface of the semiconductor chip. The solder deposit includes solder and solder flux. As mentioned previously, a dielectric layer is arranged over the surface of the semiconductor chip and has an opening within which the contact portion of the chip pad is exposed. The dielectric layer further comprises a solder flux outgassing trench arranged separate from the opening and intersecting with the solder deposit.

At S2 the solder deposit is melted, thereby causing liquid solder to be moved over the solder flux outgassing trench for extraction of flux gas.

The following examples pertain to further aspects of the disclosure:

Example 1 is a semiconductor chip including a chip pad arranged at a surface of the semiconductor chip; a dielectric layer arranged at the surface of the semiconductor chip, the dielectric layer having an opening within which a contact portion of the chip pad is exposed, the opening having at least one straight side; and wherein the dielectric layer comprises a solder flux outgassing trench arranged separate from and in the vicinity of the at least one straight side of the opening and extending laterally beyond sides of the opening adjoining the straight side.

In Example 2, the subject matter of Example 1 can optionally include wherein the solder flux outgassing trench comprises a straight trench portion that runs parallel to the straight side of the opening.

In Example 3, the subject matter of Example 1 or 2 can optionally include wherein the solder flux outgassing trench has a rectangular shape.

In Example 4, the subject matter of any preceding Example can optionally include wherein the solder flux outgassing trench surrounds the opening.

In Example 5, the subject matter of any preceding Example can optionally include wherein the straight side of the opening has a length equal to or smaller than the length of the sides of the opening adjoining the straight side.

In Example 6, the subject matter of any preceding Example can optionally include wherein the solder flux outgassing trench has a width between 10 and 20 µm.

In Example 7, the subject matter of any preceding Example can optionally include wherein the solder flux outgassing trench has a depth between 6 and 10 µm.

In Example 8, the subject matter of any preceding Example can optionally include wherein the contact portion of the chip pad has a pad size equal to or greater than 0.2 mm or 0.3 mm along the straight side and/or equal to or greater than 0.4 mm or 0.5 mm along the sides adjoining the straight side.

In Example 9, the subject matter of any preceding Example can optionally include wherein the semiconductor chip is a power transistor and the chip pad is a gate pad and/or a sense pad of the power transistor.

Example 10 is a semiconductor device including a chip carrier; and a semiconductor chip according to any one of the preceding Examples soldered to the chip carrier.

In Example 11, the subject matter of Example 10 can optionally include wherein the chip carrier is a leadframe or a ceramic-based carrier.

Example 12 is a method of soldering a semiconductor chip to a chip carrier, the method comprising arranging a solder deposit including solder and solder flux between a contact portion of the carrier and a contact portion of a chip pad arranged at a surface of the semiconductor chip, wherein a dielectric layer is arranged over the surface of the semiconductor chip and has an opening within which the contact portion of the chip pad is exposed, wherein the dielectric layer further comprises a solder flux outgassing trench arranged separate from the opening and intersecting with the solder deposit; and melting the solder deposit, thereby causing liquid solder to be moved over the solder flux outgassing trench for extraction of flux gas.

In Example 13, the subject matter of Example 12 can optionally include solidifying the solder of the solder deposit, wherein the solder flux outgassing trench remains entirely uncovered by solidified solder.

In Example 14, the subject matter of Example 12 or 13 can optionally include wherein a percentage in volume of the solder flux is equal to or greater than 25% or 40% or 45% of the volume of the solder deposit.

In Example 15, the subject matter of one of the Examples 12 to 14 can optionally include wherein the solder flux outgassing trench comprises a straight trench portion which is oriented substantially perpendicular to the direction of solder movement during melting the solder deposit.

In Example 16, the subject matter of Example 15 can optionally include wherein the straight trench portion always communicates with outside during solder movement.

In Example 17, the subject matter of Example 15 or 16 can optionally include wherein the opening in the dielectric layer has at least one straight side and the straight trench portion runs parallel to the straight side of the opening.

In Example 18, the subject matter of one of Examples 12 to 17 can optionally include wherein the solder deposit includes at least two separate solder bumps, wherein an imaginary connecting line between the solder bumps is oriented substantially in the direction of solder movement during melting the solder deposit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of soldering a semiconductor chip to a chip carrier, the method comprising:
    arranging a solder deposit including solder and solder flux between a contact portion of the chip carrier and a contact portion of a chip pad arranged at a surface of the semiconductor chip, wherein a dielectric layer is arranged at the surface of the semiconductor chip and has an opening within which the contact portion of the chip pad is exposed, wherein the dielectric layer further comprises a solder flux outgassing trench arranged separate from the opening and intersecting with the solder deposit; and
    melting the solder deposit which causes liquid solder to be moved over the solder flux outgassing trench for extraction of flux gas.

2. The method of claim 1, further comprising:
    solidifying the solder of the solder deposit, wherein the solder flux outgassing trench remains entirely uncovered by solidified solder.

3. The method of claim 1, wherein a percentage in volume of the solder flux is equal to or greater than 25% or 40% or 45% of the volume of the solder deposit.

4. The method of claim 1, wherein the solder flux outgassing trench comprises a straight trench portion which is oriented substantially perpendicular to a direction of solder movement during melting the solder deposit.

5. The method of claim 4, wherein the straight trench portion always communicates with outside during the solder movement.

6. The method of claim 4, wherein the opening in the dielectric layer has at least one straight side and the straight trench portion runs parallel to the straight side of the opening.

7. The method of claim 1, wherein the solder deposit includes at least two separate solder bumps, and wherein an imaginary connecting line between the solder bumps is oriented substantially in the direction of solder movement during melting the solder deposit.

8. The method of claim 1, wherein a distance between the solder flux outgassing trench and the opening is equal at all sides of the opening.

9. The method of claim 1, wherein a distance is equal between the solder flux outgassing trench and sides of the opening orientated perpendicular to a main direction of solder movement during reflow.

10. The method of claim 1, wherein a distance is larger between the solder flux outgassing trench and sides of the opening orientated parallel to a main direction of solder movement during reflow.

11. The method of claim 1, wherein a contraction of the solder during reflow is equal at all sides of the opening.

12. The method of claim 1, wherein the dielectric layer further comprises a very low wettability for the liquid solder.

13. The method of claim 1, wherein the solder flux outgassing trench has a rectangular shape.

14. The method of claim 1, wherein the solder flux outgassing trench surrounds the opening.

15. The method of claim 1, wherein the solder flux outgassing trench has a width between 10 and 20 µm.

16. The method of claim 1, wherein the solder flux outgassing trench has a depth between 6 and 10 µm.

17. The method of claim 1, wherein the semiconductor chip is a power transistor and the chip pad is a gate pad and/or a sense pad of the power transistor.

18. The method of claim 1, wherein the chip carrier is a leadframe or a ceramic-based carrier.

* * * * *